United States Patent
Freund

(10) Patent No.: US 8,960,969 B2
(45) Date of Patent: Feb. 24, 2015

(54) SEMICONDUCTOR STRUCTURE WITH WAVEGUIDE

(71) Applicant: LSI Corporation, Milpitas, CA (US)

(72) Inventor: Joseph M. Freund, Fogelsville, PA (US)

(73) Assignee: LSI Corporation, San Jose, CA (US)

( * ) Notice: Subject to any disclaimer, the term of this patent is extended or adjusted under 35 U.S.C. 154(b) by 246 days.

(21) Appl. No.: 13/630,788

(22) Filed: Sep. 28, 2012

(65) Prior Publication Data
US 2014/0092621 A1 Apr. 3, 2014

(51) Int. Cl.
*F21V 17/02* (2006.01)
*F21S 4/00* (2006.01)
*F21V 21/00* (2006.01)
*F21S 8/00* (2006.01)
*H01L 33/32* (2010.01)
*F21V 8/00* (2006.01)
(Continued)

(52) U.S. Cl.
CPC .............. *H01L 33/32* (2013.01); *G02B 6/0006* (2013.01); *H01L 33/58* (2013.01); *G02B 6/353* (2013.01); *G02B 6/0008* (2013.01); *G02B 6/266* (2013.01); *G06F 1/1616* (2013.01); *G06F 1/1637* (2013.01); *H04M 1/0214* (2013.01); *H04M 1/22* (2013.01)
USPC ...... 362/321; 362/319; 362/249.07; 362/277; 362/282

(58) Field of Classification Search
CPC ....... H01L 33/60; F21V 7/0016; G02B 26/04; G02B 6/266; G02B 6/4246; G02B 6/353
USPC .......... 362/233, 249.03, 249.07–249.09, 271, 362/272, 277, 282, 285–286, 319, 362/321–325; 359/230
See application file for complete search history.

(56) References Cited

U.S. PATENT DOCUMENTS

| 5,708,280 A | 1/1998 | Lebby et al. |
| 6,536,921 B1 * | 3/2003 | Simon ........................ 362/277 |

(Continued)

FOREIGN PATENT DOCUMENTS

| EP | 2269901 A1 | 1/2011 |
| WO | 2011/045663 A1 | 4/2011 |

OTHER PUBLICATIONS

"New UV Optical Fiber with Stable Transmission, FD Series Optical Fibers," http://www.polymicro.com/tech/whitepapers/whitepaper_2006MAR29.htm, Mar. 2006, 3 pages.

(Continued)

*Primary Examiner* — Ismael Negron
*Assistant Examiner* — Erin Kryukova

(57) ABSTRACT

A light-emitting diode (LED) apparatus comprises a substrate, a first layer formed over at least a portion of the substrate, an active layer formed over at least a portion of the first layer, a second layer formed over at least a portion of the active layer, and at least one waveguide formed below the substrate. A first portion of light from the LED is directed in a first direction and a second portion of light from the LED is directed in a second direction via the waveguide, the second direction being different than the first direction. The apparatus may further comprise a shutter formed at least one of above and below the waveguide, the shutter being adjustable to control an amount of light entering or exiting the waveguide.

20 Claims, 5 Drawing Sheets

(51) Int. Cl.
*H01L 33/58* (2010.01)
*G02B 6/35* (2006.01)
*G02B 6/26* (2006.01)
*G06F 1/16* (2006.01)
*H04M 1/02* (2006.01)
*H04M 1/22* (2006.01)

(56) References Cited

U.S. PATENT DOCUMENTS

| | | | |
|---|---|---|---|
| 6,634,770 B2* | 10/2003 | Cao | 362/294 |
| 6,641,287 B2* | 11/2003 | Suehiro | 362/298 |
| 6,674,496 B2* | 1/2004 | Wei | 349/63 |
| 6,972,889 B2* | 12/2005 | Goodwin-Johansson et al. | 359/290 |
| 7,033,061 B1* | 4/2006 | Wu | 362/607 |
| 7,121,691 B2* | 10/2006 | Coushaine et al. | 362/298 |
| 7,848,004 B2* | 12/2010 | Miles | 359/291 |
| 2003/0016536 A1* | 1/2003 | Lin | 362/250 |
| 2004/0046123 A1* | 3/2004 | Dausch | 250/351 |
| 2004/0155565 A1 | 8/2004 | Holder et al. | |
| 2005/0128770 A1* | 6/2005 | Lin | 362/602 |
| 2006/0203516 A1* | 9/2006 | Watanabe et al. | 362/615 |
| 2007/0086211 A1* | 4/2007 | Beeson et al. | 362/628 |
| 2007/0176186 A1* | 8/2007 | Lin | 257/79 |
| 2007/0279558 A1* | 12/2007 | Chang | 349/113 |
| 2008/0193142 A1* | 8/2008 | Kopp et al. | 398/139 |
| 2009/0302343 A1* | 12/2009 | Sato et al. | 257/98 |
| 2009/0303443 A1* | 12/2009 | Wachter | 353/20 |
| 2010/0177497 A1* | 7/2010 | Leung et al. | 362/84 |
| 2010/0283078 A1* | 11/2010 | DenBaars et al. | 257/98 |
| 2010/0321953 A1 | 12/2010 | Coleman et al. | |
| 2011/0103077 A1 | 5/2011 | Pan et al. | |
| 2011/0170293 A1* | 7/2011 | Murai et al. | 362/245 |
| 2011/0242809 A1 | 10/2011 | Medendorp et al. | |

OTHER PUBLICATIONS

"UV Non Solarizing Silica/Silica Fiber Exclusive Bundle and Assembly Fiber," http://www.ceramoptec.com/products/sub_content.asp?SubnavID=13&ThirdNavID=13, 3 pages.

"Light-Emitting Diodes and Lighting," Handbook of Nitride Semiconductors and Devices, 2009, pp. 1-168, vol. 3.

"LEDs & Laser Diodes," Electus Distribution Reference Data Sheet: ledlaser.pdf (1), 2001, 3 pages.

Yukio Narukawa, "White-Light LEDs," Optics & Photonics News, Apr. 2004, 6 pages.

U.S. Appl. No. 13/617,169, filed in the name of Joseph M. Freund on Sep. 14, 2012 and entitled "Semiconductor Structure with Patterned Buried Layer."

U.S. Appl. No. 13/523,140, filed Jun. 14, 2012 and entitled "Computer Input Device."

* cited by examiner

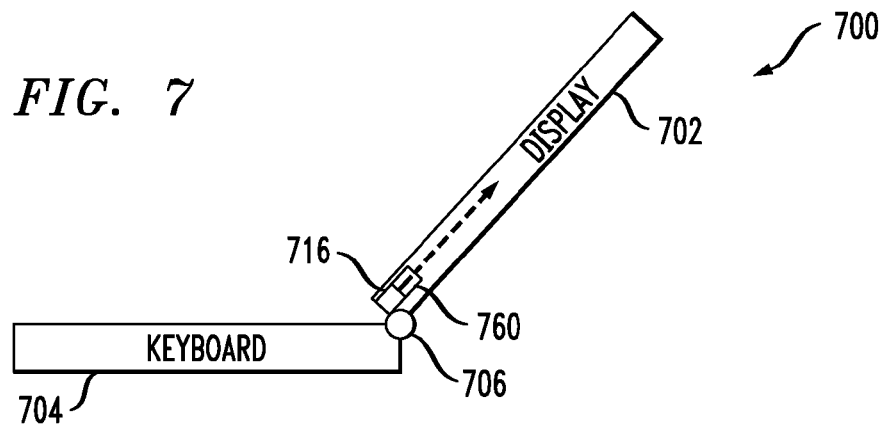
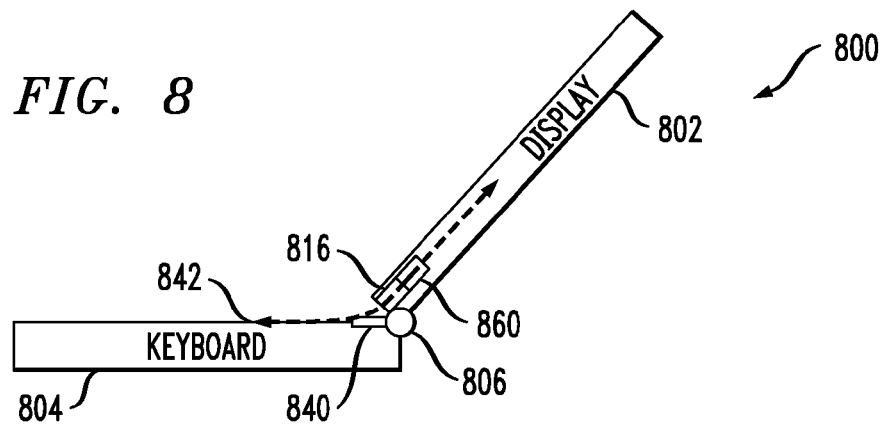
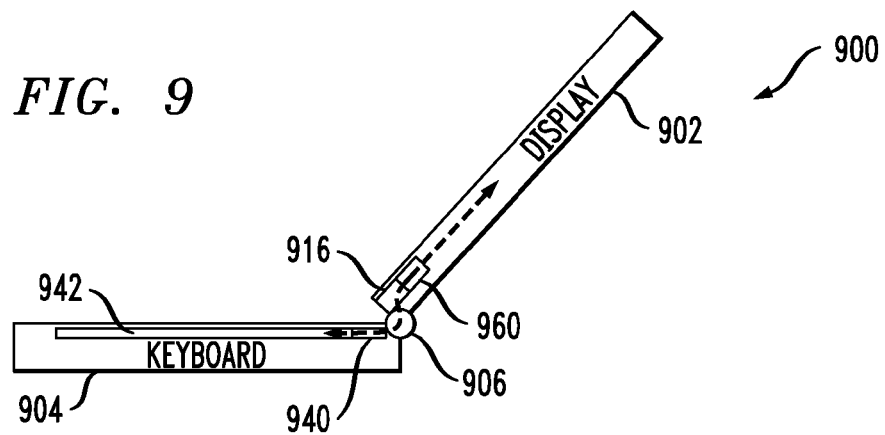

SEMICONDUCTOR STRUCTURE WITH WAVEGUIDE

BACKGROUND

Solid-state lighting (SSL) technologies are used in a wide variety of lighting applications. As SSL technologies improve in areas such as energy efficiency, cost, and lifespan, such technologies represent viable alternatives to conventional lighting technologies in general illumination and display applications. One example of an SSL technology is semiconductor light-emitting diodes (LEDs). Semiconductor LEDs are used in various electronic, display and lighting applications. For example, display screens on devices such as televisions, monitors, and cell phones may use LED-backlit displays.

Nitride-based LEDs are one example LED type. Nitride LED improvements have focused on increasing light extraction rather than improving light generation efficiency. Flip-chip configurations of nitride LEDs have become widely used. In flip-chip configurations, light is emitted through the substrate on which the LED structures are grown. Light generation in flip-chip configurations, however, is not limited to a specific direction. Therefore, in order to increase light output, techniques for reflecting light emitted from the substrate in a desired direction are typically used.

Semiconductor LEDs typically emit light in all directions, with only a fraction of the emitted light escaping the LED package. To combat this loss, various packaging designs may be used. For example, in 5 mm LED packages in single diode applications, a reflector can be mounted or positioned to reflect light in a desired direction. Reflectors are particularly advantageous when used in conjunction with an LED package comprising a sapphire substrate. Sapphire substrates are transparent, and thus do not absorb the wavelength of interest for photons traversing the LED structure. The bottom of the sapphire substrate may be thinned by polishing to facilitate breaking of the wafer into LED chips and to eliminate absorption at the otherwise rough surface.

Various other techniques can be used to improve the output light efficiency of LED structures. For example, patterned sapphire substrates may be used. Another technique involves using patterned buried layers in the LED structure, as disclosed in U.S. patent application Ser. No. 13/617,169, filed Sep. 14, 2012 and entitled "Semiconductor Structure with Patterned Buried Layer," which is commonly assigned herewith and incorporated by reference herein.

SUMMARY

Illustrative embodiments of the present invention provide an improved LED structure and package configured to emit light in two or more desired directions.

In one embodiment of the invention, an LED apparatus comprises a substrate, a first layer formed over at least a portion of the substrate, an active layer formed over at least a portion of the first layer, a second layer formed over at least a portion of the active layer, and at least one waveguide formed below the substrate. A first portion of light from the LED is directed in a first direction and a second portion of light from the LED is directed in a second direction via the waveguide, the second direction being different than the first direction.

More particularly, in one or more embodiments the apparatus may further comprise a reflector formed below the substrate, the reflector comprising at least one aperture, wherein the waveguide is aligned with the aperture such that light entering the aperture enters the waveguide.

The apparatus may further comprise a shutter formed at least one of above and below the waveguide, the shutter being adjustable to control an amount of light entering or exiting the waveguide.

The shutter may be adjustable in at least a first position wherein the shutter completely covers the opening in the waveguide, a second position wherein the shutter covers at least a portion of the opening in the waveguide, and a third position wherein the shutter does not cover the opening in the waveguide.

The waveguide may have an opening formed therethrough.

In another embodiment of the invention, a method comprises reflecting a first portion of light from an LED in a first direction using a reflector formed below a substrate within a package of the LED and directing a second portion of light from the LED through at least one aperture formed in the reflector and through a waveguide formed below the reflector in the LED package in a second direction different than the first direction, the waveguide being aligned with the aperture such that light entering the aperture enters the waveguide such that the LED package is configured to emit light simultaneously in the first direction and the second direction.

In another embodiment of the invention, a processing device comprises control circuitry comprising a processor coupled to a memory and at least one LED. The at least one LED comprises a substrate, a first layer formed over at least a portion of the substrate, an active layer formed over at least a portion of the first layer, a second layer formed over at least a portion of the active layer, and at least one waveguide formed below the substrate. A first portion of light from the LED is directed in a first direction and a second portion of light from the LED is directed in a second direction via the waveguide, the second direction being different than the first direction.

BRIEF DESCRIPTION OF THE DRAWINGS

FIG. 7 shows a computing device, according to an embodiment of the invention.

FIG. 8 shows an alternate computing device, according to an embodiment of the invention.

FIG. 9 shows an alternate computing device, according to an embodiment of the invention.

DETAILED DESCRIPTION

Embodiments of the invention will be illustrated herein in conjunction with an exemplary apparatus, method, device, etc. It is to be understood, however, that techniques of the present invention are not limited to the apparatus, methods, and devices shown and described herein. Rather, the invention is more generally applicable to various other apparatus, methods and devices.

As efforts and improvements in the efficiency of LEDs continue, the need to couple all of the light for a primary application will not be a strict design constraint. With this freedom, products and product features can be developed which facilitate the need for an LED structure and package which can emit light controllably in more than one direction. Embodiments of the invention provide an improved LED structure and package configured to emit light in two or more desired directions.

Embodiments of the invention may be described below in the context of Gallium Nitride (GaN) based LEDs. The invention, however, is not limited solely to use with GaN based LEDs, but is instead more generally applicable to various semiconductor LED structures and arrangements in which it is desirably to emit light controllably in more than one direction. Embodiments of the invention may be used in a variety of applications and products, including flashlights, bike lights, cap lights, display backlighting, etc. as will be described in detail below. One skilled in the art will readily appreciate that various other examples are possible and that embodiments of the invention are not limited to use solely in the above and to be described below applications and products.

Figure 1:
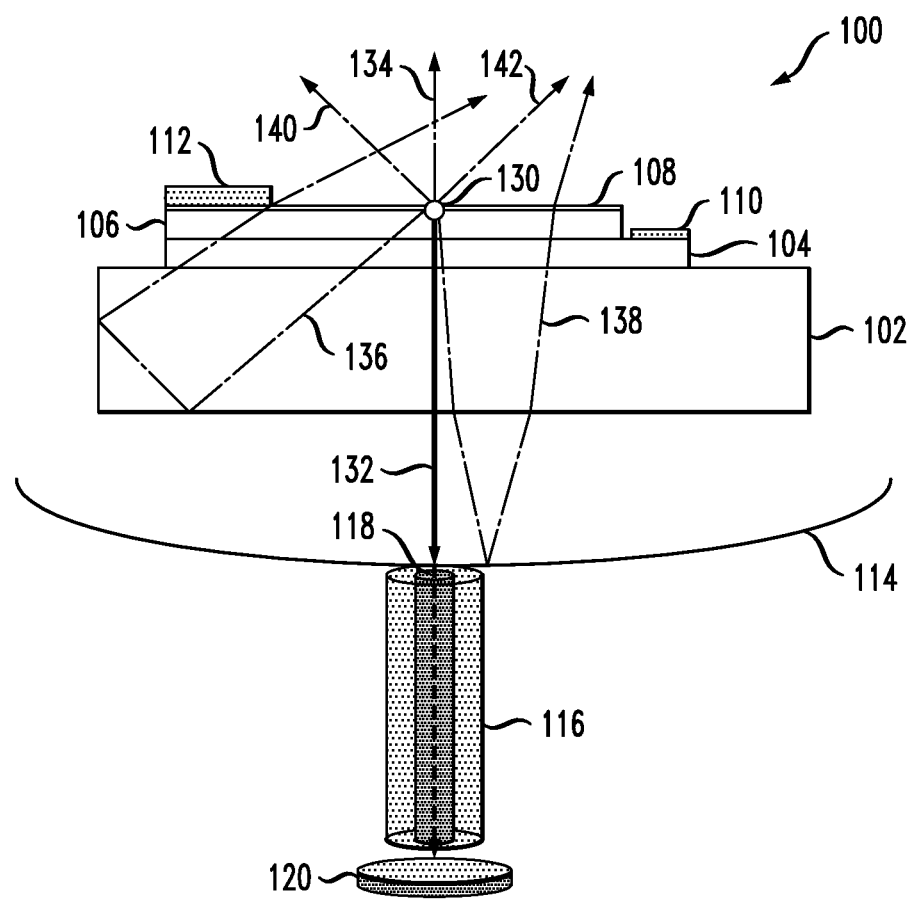
FIG. 1 shows an LED structure, according to an embodiment of the invention.

FIG. 1 illustrates an LED structure 100. The LED structure includes a substrate 102, a first layer 104 formed over the substrate 102, and active layer 106 formed over the first layer 104, and a second layer 108 formed over the active layer 106. The substrate 102 may be a sapphire substrate. Although the substrate 102 as shown in FIG. 1 is not patterned, in some embodiments patterned substrates may be used. Inductively coupled-plasma reactive-ion etching (ICP-RIE), dry etching or wet etching can be used to create patterned mesas in the substrate 102. The substrate 102, along with the first layer 104, the active layer 106 and second layer 108 may be grown using metal-organic chemical vapor deposition (MOCVD). One skilled in the art will readily appreciate that various other suitable processes may be used to form these layers, including molecular beam epitaxy (MBE). The substrate 102 may alternately comprise a sapphire substrate and layer of undoped GaN. The substrate 102 may range in thickness as desired for a particular application. As one example, the substrate 102 may be approximately 4.5 μm thick.

The first layer 104 may be formed of GaN. The first layer 104 may also be formed of alternating layers of Indium Gallium Nitride (InGaN) and GaN, or alternative layers of Aluminum Gallium Nitride (AlGaN) and GaN to create a distributed Bragg reflector (DBR) structure to improve light extraction efficiency. The first layer 104 may vary in thickness as desired for a particular application. As one example, the first layer 104 may be approximately 3 μm thick. The first layer 104 may be doped with a first conductivity type and the second layer 108 may be doped with a second conductivity type different than the first conductivity type. For example, in some embodiments, the first layer 104 may be n-doped while the second layer 108 may be p-doped, or vice versa.

The active layer 106 may comprise GaN, InGaN, AlGaN, or alternating layers of these materials. One skilled in the art will readily appreciate that various other materials may be used, not only for the active layer 106, but for the first layer 104, second layer 108, and substrate 102. The active layer 106 may be formed with any desired thickness. In some embodiments, the active layer 106 has a thickness of approximately 20 to 60 nm.

The second layer 108 may be formed of GaN, alternating layers of InGaN and GaN, alternating layers of AlGaN and GaN, etc. similar to that described above with respect to the first layer 104. As described above, the first layer 104 and the second layer 108 may be doped with different conductivity types. The second layer 108 may be formed with any desired thickness. In some embodiments, the second layer 108 has a thickness of approximately 20 to 100 nm. It should be noted that the relative thickness of the substrate 102, the first layer 104, the active layer 106, and the second layer 108 are not to scale in FIG. 1. FIG. 1 also shows a first electrode 110 formed on the first layer 104 and a second electrode 112 formed on the second layer 108. The electrodes 110 and 112 may be considered to be an n-electrode and a p-electrode, respectively, when the first layer 104 is n-doped and the second layer 108 is p-doped, and vice versa. The electrodes 110 and 112 may be formed of any suitable material. While not explicitly shown in FIG. 1, the LED structure 100 may further comprise a capping layer form over the second layer 108. The capping layer may be formed of GaN.

FIG. 1 also shows a reflector 114, formed below the substrate 102. The reflector may be formed of any suitable material, such as gold or titanium-plated gold. Aluminum may also be used as a more cost effective alternative, although aluminum is typically less reflective than gold or titanium plated gold. In the LED structure 100, light is emitted in all directions from the active layer 106. For clarity, FIG. 1 shows light emitting from a point 130 in the active layer 106. For example, light may be emitted in direction 134 perpendicular to the top surface of the active layer 106. Typically, direction 134 is the primary desired direction for the emission of light from the LED structure 100. In the LED structure 100, however, light is not emitted solely in direction 134. Instead, light is emitted in all directions. For clarity, FIG. 1 only shows light emitted in directions 132, 134, 136 138, 140 and 142. Direction 132 is a direction 180° from the primary desired direction 134. Light emitted in direction 136 may be reflected at edges of the substrate through a top surface of the second layer 108. Light emitted in direction 138 may exit the substrate 102 and be reflected from the reflector 114 back up through the substrate 102, the first layer 104, the active layer 106 and the second layer 108 as shown in FIG. 1. Light may also be emitted in directions 140 and 142 in an upwards direction as shown in FIG. 1. The particular path of light emitted from point 130 is dependent on the refractive indices and the direction at which the light approaches edges of the various layers of the semiconductor structure.

A waveguide 116 is formed below the reflector 114 in FIG. 1. The waveguide 116 has an opening 118 formed therethrough aligned with an aperture in the reflector 114. Advantageously, this allows light emitted in direction 132 to pass through the opening 118 in the waveguide 116. This allows the LED structure 100 to emit light in two directions, a primary direction which extends upwards from the top surface of the second layer 108 and a secondary direction which extends through the opening 118 in the waveguide 116. A shutter 120, which will be described in further detail below, may be formed below the waveguide 116 as shown in FIG. 1. The shutter 120 may be positioned to control the amount of light which exits the bottom of the waveguide 116. Preferably, the top surface of the shutter 120 is a reflective surface such as gold, titanium plated gold, or aluminum as described above. With the top surface of the shutter 120 being a reflective surface, when the shutter 120 is positioned such that light does not exit the bottom of the waveguide 116, the light is reflected back upwards through the waveguide 116 in the primary direction 134.

Figure 2:
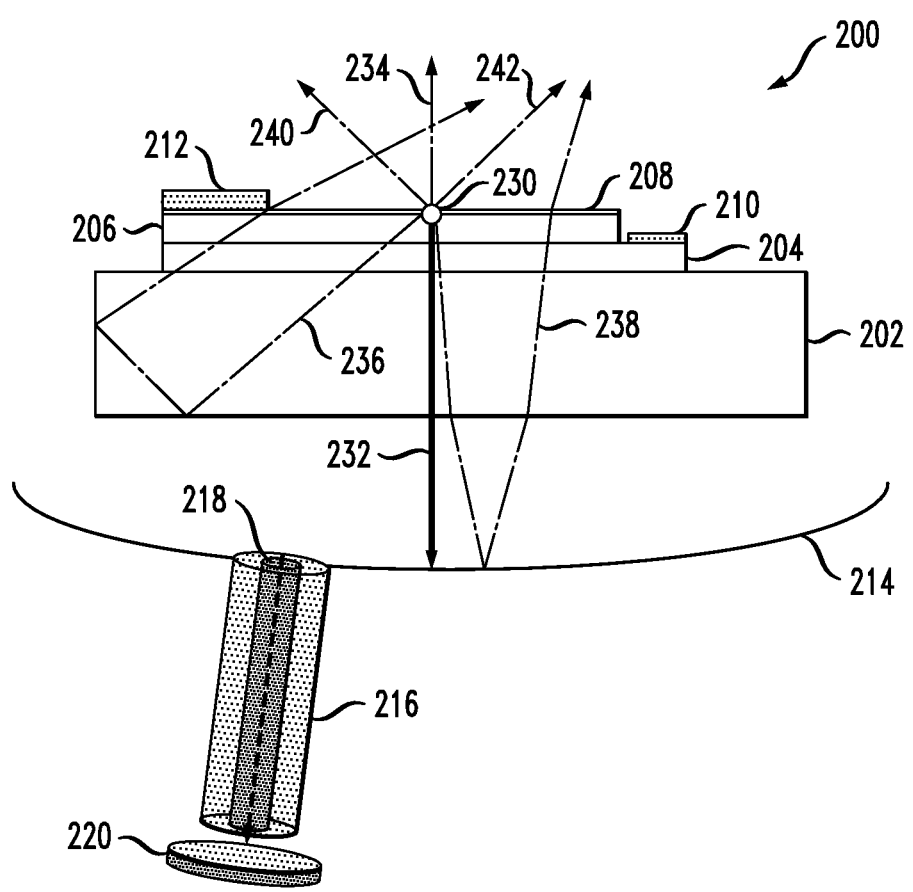
FIG. 2 shows an alternate LED structure, according to an embodiment of the invention.

Although the waveguide 116 is positioned such that the opening 118 is 180° from direction 134, various other arrangements are possible. For example, FIG. 2 shows an LED structure 200. Substrate 202, first layer 204, active layer 206, second layer 208, first electrode 210, second electrode 212, reflector 214, waveguide 216, opening 218 and shutter 220 correspond to substrate 102, first layer 104, active layer 106, second layer 108, first electrode 110, second electrode 112, reflector 114, waveguide 116, opening 118 and shutter 120 as shown and described in FIG. 1.

Again, for clarity purposes FIG. 2 shows light emitting from a point 230 in the active layer 206. Light is emitted in directions 232, 234, 236, 238, 240 and 242 which correspond to directions 132, 134, 136, 138, 140 and 142 in FIG. 1. In FIG. 2, however, the opening 218 in the waveguide 216 is not positioned 180° from direction 234. Instead, the opening 218 in the waveguide 216 is offset at a different angle to emit light in a secondary direction different from that shown in FIG. 1. Embodiments of the invention allow for a waveguide to be placed at any desired location. When the LED structure also comprises a reflector, the reflector should include an aperture aligned with the opening in the waveguide. In addition, although FIGS. 1 and 2 show arrangements where a single waveguide is used, in other embodiments the LED structure can include multiple waveguides positioned at desired locations.

The waveguides 116 and 216 may be formed of any suitable material, including silica, fluorides, phosphates, chalcogenides, etc. as will be appreciated by one skilled in the art. The waveguides 116 and 216 may also vary in size and length as desired for a particular application or product. In some embodiments, the openings 118 and 218 are between 125 and 300 microns in diameter. It is also important to note that while the waveguides 116 and 216 are shown as straight cylinders in FIGS. 1 and 2, various other shapes and arrangements are possible. For example, the waveguides may be curved as desired. The openings in the waveguide may not have a uniform diameter, but instead may vary as desired. For example, the openings may be wider at the top of the waveguide where light enters the waveguide than at the bottom where light exits the waveguide. In addition, the waveguide may be a cube or other shape rather than a cylinder. Although the waveguides 116 and 216 are shown as having respective openings 118 and 218 formed therethrough, embodiments of the invention are not limited solely to arrangements in which a waveguide has an opening. In some embodiments, the waveguide may be an optical fiber. One skilled in the art will readily appreciate that a variety of other shapes and arrangements for the waveguide are possible.

It is important to note that while FIGS. 1 and 2 show LED structures 100 and 200 comprising reflectors 114 and 214, respectively, embodiments of the invention do not require LED structures which include reflectors. While the reflectors 114 and 214 can improve light extraction efficiency in LED structures 100 and 200, respectively, embodiments of the invention do not require the use of reflectors. For example, LED structures used as indicator lights mounted on a circuit board may not necessarily include a reflector. In addition, while FIGS. 1 and 2 show the waveguides 116 and 216 formed below the reflectors 114 and 214, the waveguides could also be formed or mounted above the reflectors, directly on the bottom of the substrates, or formed through the reflectors such that some portions of the waveguides are above the reflectors and other portions of the waveguides are below the reflectors.

Figure 3:
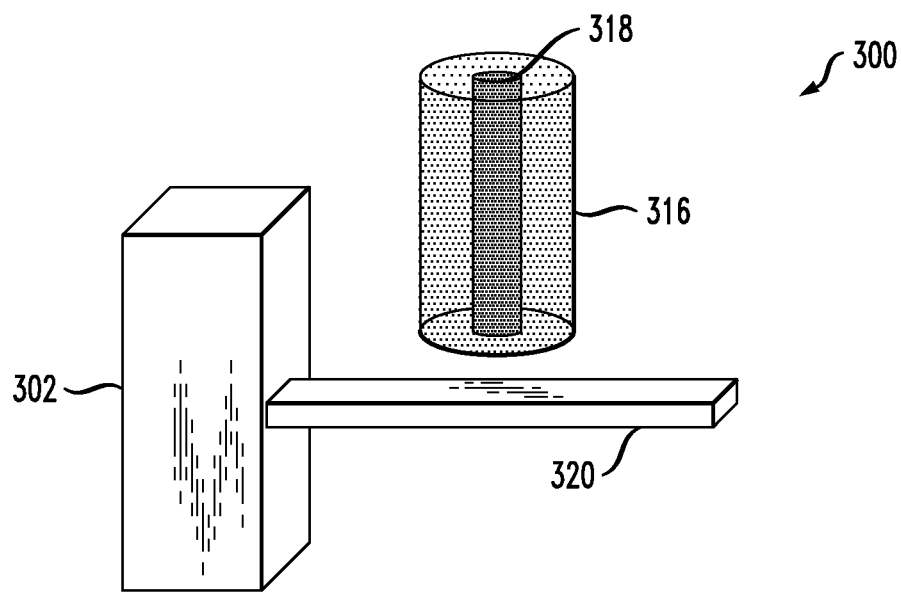
FIG. 3 shows a shutter arrangement, according to an embodiment of the invention.

FIG. 3 shows a shutter arrangement 300 which may be used in embodiments of the invention. A shutter 320 is positioned below the waveguide 316. The waveguide 316 has an opening 318 formed therethrough. The shutter 320 is coupled to control circuitry 302. Control circuitry 302 may be a micro-electro-mechanical (MEMS) device or actuator which controls the shutter 320. The shutter 320 may be a MEMS attenuator which may be controlled via one or more lead connections to an MEMS device or actuator.

Control circuitry 302 is configured to control the position of the shutter 320. For example, the control circuitry 302 may position the shutter 320 in a first position where the shutter 320 completely covers the opening 318 thus allowing no light to exit the opening 318 in the waveguide 316. As described above, the top surface of the shutter 320 may be a reflective surface so that light is reflected back up through the opening 318. The control circuitry 302 may also position the shutter 320 in a second position where the shutter 320 covers only a portion of the opening 318 in the waveguide 316. The control circuitry 302 can thus control the amount of light which exits the opening 318 in the waveguide 316 as desired. The control circuitry 302 may also position the shutter 320 in a third position where the shutter 320 does not cover any portion of the opening 318 in the waveguide 316. The control circuitry 302 can position the shutter 320 in the third position to allow a maximum amount of light to exit the opening 318 in the waveguide 316.

The control circuitry 302 may be configured to extend or retract the shutter 320 to adjust between the first, second and third positions. The control circuitry 302 may also be configured to rotate the shutter 320 to adjust between the first second and third positions. One skilled in the art will readily appreciate that various other arrangements are possible, including arrangements where the control circuitry is configured to extend, retract and rotate the shutter 320.

Figure 4:
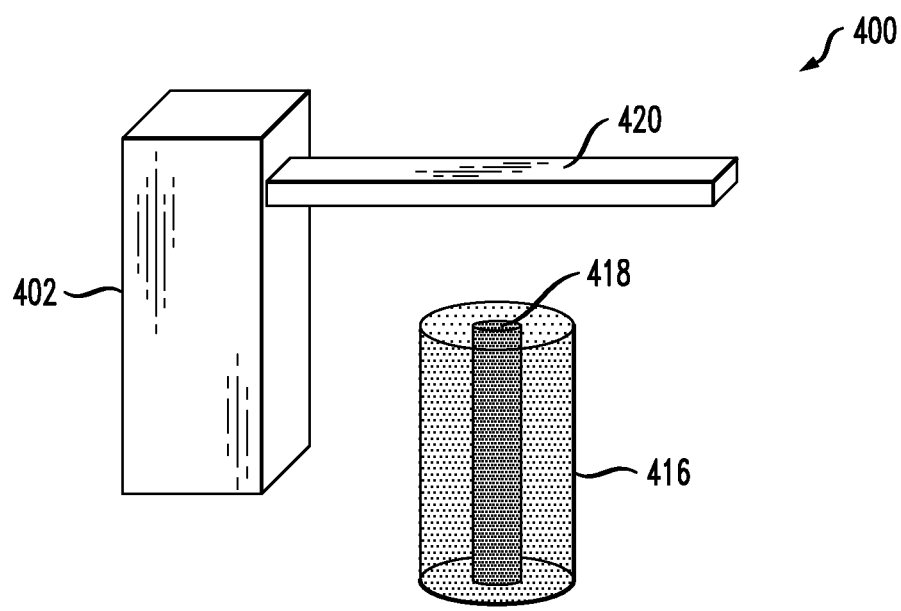
FIG. 4 shows an alternate shutter arrangement, according to an embodiment of the invention.

FIG. 4 shows an alternate shutter arrangement 400. The waveguide 416, opening 418, shutter 420 and control circuitry 402 correspond to the waveguide 316, opening 318, shutter 320 and control circuitry 302 in FIG. 3, except that the shutter 420 is positioned above the waveguide 416 in the arrangement 400 instead of below the waveguide as in the arrangement 300. In some embodiments, it may be preferred to position the shutter 420 above the waveguide 416, such that when it is desired to place the shutter 420 in the first position, light is reflected before entering the waveguide 416 rather than reflected after entering and traveling through the opening 418 in the waveguide 416. Although not shown in FIGS. 3 and 4, shutters may also be positioned inside the waveguides rather than above or below the waveguides.

Figure 5:
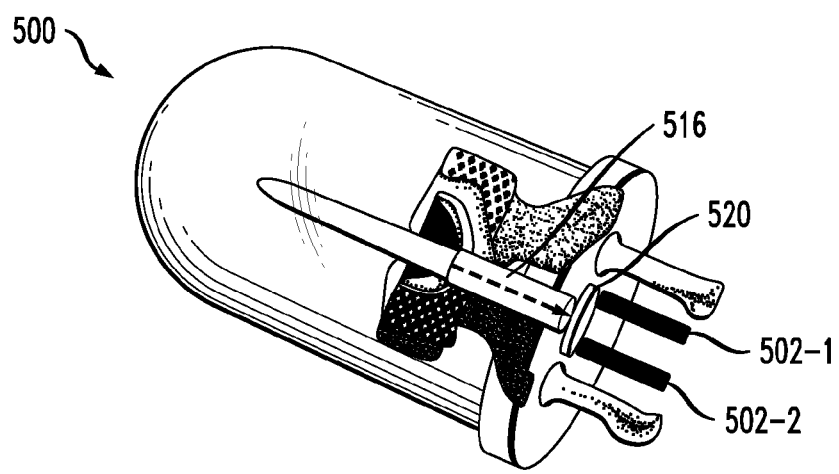
FIG. 5 shows an LED package, according to an embodiment of the invention.

The LED structures 100 and 200 and shutter arrangements 300 and 400 may be used in a variety of applications. FIG. 5 shows a 5 mm LED packaging technology 500 which incorporates the waveguide and shutter structures used in embodiments of the invention. A waveguide 516 is positioned within the LED structure as shown in FIG. 5. A shutter 520 is positioned below the waveguide 516. The shutter 520 may be a MEMS attenuator. Lead connections 502-1 and 502-2 are shown which may be used to control the shutter 520. The 5 mm LED packaging technology 500 can be used in a variety of lighting applications.

One example lighting application may be cap lights for use in cave exploration or mining The cap light may advantageously emit light directly in a primary direction in front of an individual wearing the cap light, as well as to a desired secondary location to a side, above or below the primary direction. Another example lighting application is bike lights. The bike light may be configured to illuminate a direction directly in front of the path of the bicycle, as well as above or below or to a particular side of the path. Using the shutter or attenuator assembly, the bike light could be configured to act as a turn signal.

Figure 6:
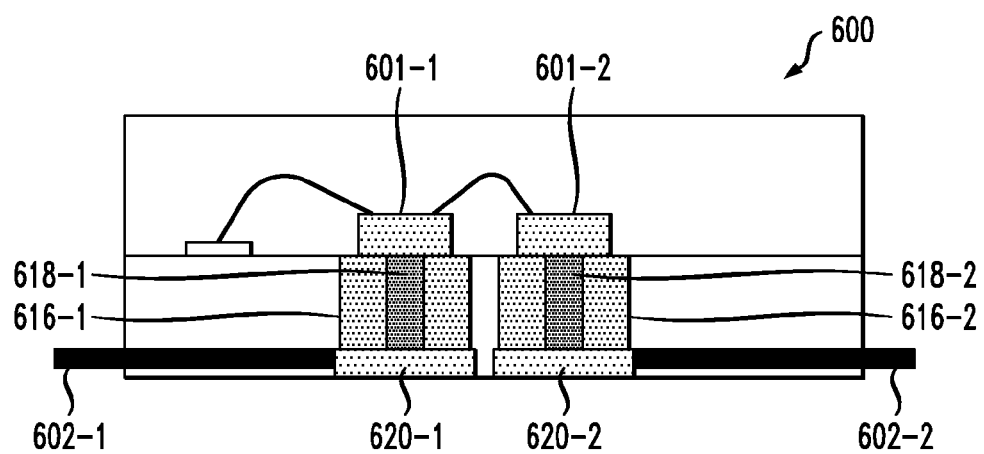
FIG. 6 shows an LED backlight structure, according to an embodiment of the invention.

FIG. 6 shows an LED backlight arrangement 600 which incorporates LED structures with waveguides and shutter arrangements as described above. The backlight arrangement 600 includes LEDs 601-1 and 601-2. LED 601-1 has an associated waveguide 616-1 with an opening 618-1, as well as shutter 620-1 and lead connection 602-1. Similarly, LED 601-2 has an associated waveguide 616-2 with an opening 618-2, as well as shutter 620-2 and lead connection 602-2. The lead connections 602-1 and 602-2 may be used to control the shutters 620-1 and 620-2, respectively. Display backlighting applications typically use an array of LEDs to provide broad and uniform illumination. Although FIG. 6 shows a backlight arrangement 600 with only two LEDs 601-1 and 601-2, embodiments are not limited solely to this arrangement. Instead, embodiments may include any number of LEDs as required for a particular backlight arrangement.

FIGS. 7-9 show arrangements where LED structures with waveguides as described above may be incorporated in computing devices 700, 800 and 900. Computing devices 700, 800, and 900 are shown as laptop computers, with top housings 702, 802 and 902 including displays and a bottom housings 704, 804 and 904 including keyboards which are coupled via hinges 706, 806 and 906.

FIG. 7 shows computing device 700. Computing device 700 has backlight LEDs 760 and a waveguide 716 which directs light from the back or bottom of the backlight LEDs 760. The waveguide 716 may be used to direct light out the bottom of the top housing 702. This light can be used to illuminate the keyboard.

FIG. 8 shows computing device 800. Computing device 800 has backlight LEDs 860 and waveguide 816 for directing a portion of the light emitted from the backlight LEDs 860 out the bottom of the top housing 802 onto the bottom housing 804. A reflector 840 may be positioned on the bottom housing 804 to improve illumination of the keyboard in direction 842.

FIG. 9 shows computing device 900. Computing device 900 has backlight LEDs 960 and a waveguide 916. The waveguide 916 is used with a light pipe 940 which passes from the top housing 902 through the hinge 906 and into the bottom housing 904. The waveguide 916 directs a portion of the light emitted from backlight LEDs 960 through the light pipe 940 to illuminate the Fresnel lens structure 942 to backlight the keyboard in the bottom housing 904.

Embodiments of the invention are not limited solely to laptop computing devices as shown in FIGS. 7-9. Instead, embodiments can be incorporated in various other computing devices such as cell phones, tablets, etc. LEDs which are used to backlight the display of a cell phone or tablet may have a waveguide incorporated in the backlight LED structure which directs a portion of the light emitted from the backlight LEDs in another direction. For example, waveguides in the LED structure can be used to direct a portion of the light for use as an indicator or notification light. The waveguides may also be used to direct a portion of the light for use as a flash for a camera of the cell phone, tablet, or other computing device. One skilled in the art will readily appreciate that various other examples are possible.

It should be emphasized that the above-described embodiments of the invention are intended to be illustrative only. These and numerous other alternative embodiments within the scope of the following claims will be apparent to those skilled in the art.

What is claimed is:
1. A light-emitting diode (LED) apparatus, comprising:
 a substrate;
 a first layer formed over at least a portion of the substrate;
 an active layer formed over at least a portion of the first layer;
 a second layer formed over at least a portion of the active layer; and
 at least one waveguide formed below the substrate;
 a reflector formed between the substrate and said at least one waveguide, the reflector comprising at least one aperture;
 a shutter formed below the reflector and one of above and below said at least one waveguide, the shutter being adjustable to control an amount of light entering or exiting said at least one waveguide;
 wherein a first portion of light from the LED apparatus is directed in a first direction and wherein a second portion of light from the LED apparatus is directed in a second direction via said at least one waveguide, the second direction being different than the first direction; and
 wherein said at least one waveguide is aligned with said at least one aperture such that light entering said at least one aperture enters said at least one waveguide.

2. The apparatus of claim 1, wherein the shutter is adjustable in at least: a first position wherein the shutter completely covers an opening of said at least one waveguide; a second position wherein the shutter covers at least a portion of the opening of said at least one waveguide; and a third position wherein the shutter does not cover the opening of said at least one waveguide.

3. The apparatus of claim 2, further comprising control circuitry configured to position the shutter in the first, second and third positions.

4. The apparatus of claim 3, wherein the control circuitry comprises a micro electro-mechanical (MEMS) device.

5. The apparatus of claim 1, wherein a top surface of the shutter is a reflective surface.

6. The apparatus of claim 1, wherein the active layer is configured to emit light substantially omnidirectionally and the reflector is curved such that light emitted from the active layer is reflected from a top surface of the reflector in a desired direction.

7. The apparatus of claim 6, wherein the desired direction is a direction extending upwards perpendicular to a top surface of the second layer.

8. The apparatus of claim 7, wherein the at least one aperture is positioned 180 degrees from the desired direction.

9. The apparatus of claim 1, wherein the substrate comprises sapphire, the first layer comprises Gallium Nitride (GaN), the active layer comprises Indium Gallium Nitride (InGaN) and the second layer comprises GaN.

10. The apparatus of claim 1, wherein the first layer is doped with a first conductivity type and the second layer is doped with a second conductivity type different than the first conductivity type.

11. The apparatus of claim 1, wherein the waveguide has an opening formed therethrough.

12. A method, comprising:
 reflecting a first portion of light from a light-emitting diode (LED) in a first direction using a reflector formed between a substrate and at least one waveguide formed below the reflector within a package of the LED;
 directing a second portion of light from the LED through at least one aperture formed in the reflector and through said at least one waveguide in a second direction different than the first direction, said at least one waveguide being aligned with said at least one aperture such that light entering said at least one aperture enters said at least one waveguide such that the LED package is configured to emit light simultaneously in the first direction and the second direction; and
 controlling a shutter formed below the reflector and one of above and below said at least one waveguide so as to adjust an amount of light entering or existing said at least one waveguide.

13. The method of claim 12, wherein the shutter is adjustable in at least: a first position wherein the shutter completely covers an opening of said at least one waveguide; a second position wherein the shutter covers at least a portion of the opening of said at least one waveguide; and a third position wherein the shutter does not cover the opening of said at least one waveguide.

14. A processing device, comprising:
control circuitry comprising a processor coupled to a memory; and
at least one light-emitting diode (LED) comprising: a substrate; a first layer formed over at least a portion of the substrate; an active layer formed over at least a portion of the first layer; a second layer formed over at least a portion of the active layer; at least one waveguide formed below the substrate; a reflector formed between the substrate and said at least one waveguide, the reflector comprising at least one aperture; and a shutter formed below the reflector and one of above and below said at least one waveguide, the shutter being adjustable to control an amount of light entering or exiting said at least one waveguide;
wherein a first portion of light from the LED is directed in a first direction and wherein a second portion of light from the LED is directed in a second direction via said at least one waveguide, the second direction being different than the first direction; and
wherein said at least one waveguide is aligned with said at least one aperture such that light entering said at least one aperture enters said at least one waveguide.

15. The processing device of claim 14, further comprising a display and at least one other component, the LED being configured to: emit light the first direction to backlight the display; and emit light in a second direction through said at least one aperture and an opening in said at least one waveguide to illuminate the at least one other component.

16. The processing device of claim 15, wherein the at least one other component comprises a keyboard.

17. The apparatus of claim 2, wherein a top surface of the shutter is reflective such that:
the shutter in the first position reflects light entering the opening of the waveguide towards the first direction;
the shutter in the second position reflects at least a portion of light entering the opening of the waveguide towards the first direction; and
the shutter in the third position does not reflect light entering the opening of the waveguide towards the first direction.

18. The method of claim 13, wherein a top surface of the shutter is reflective such that:
the shutter in the first position reflects light entering the opening of the waveguide towards the first direction;
the shutter in the second position reflects at least a portion of light entering the opening of the waveguide towards the first direction; and
the shutter in the third position does not reflect light entering the opening of the waveguide towards the first direction.

19. The processing device of claim 14, wherein the shutter is adjustable in at least:
a first position wherein the shutter completely covers an opening of said at least one waveguide; a second position wherein the shutter covers at least a portion of the opening of said at least one waveguide; and a third position wherein the shutter does not cover the opening of said at least one wave guide.

20. The processing device of claim 19, wherein a top surface of the shutter is reflective such that:
the shutter in the first position reflects light entering the opening of the waveguide towards the first direction;
the shutter in the second position reflects at least a portion of light entering the opening of the waveguide towards the first direction; and
the shutter in the third position does not reflect light entering the opening of the waveguide towards the first direction.

* * * * *